(12) United States Patent
Nagashima et al.

(10) Patent No.: US 6,468,665 B1
(45) Date of Patent: Oct. 22, 2002

(54) PROCESS FOR MELT-BONDING MOLDED ARTICLE OF LIQUID CRYSTALLINE POLYESTER WITH METAL

(75) Inventors: Tohru Nagashima, Tsukuba (JP); Hiroshi Nakamura, Tsuchiura (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/461,202

(22) Filed: Dec. 15, 1999

(30) Foreign Application Priority Data

Dec. 16, 1998 (JP) ............................. 10-357548

(51) Int. Cl.[7] .................. B29C 65/14; B32B 15/08; B32B 27/36; B32B 31/24
(52) U.S. Cl. ................. 428/458; 156/272.2; 156/273.3; 156/308.2; 156/309.6; 428/901
(58) Field of Search ........................ 156/219, 272.2, 156/272.6, 273.3, 308.2, 309.6; 264/446; 428/458, 901; 427/553, 558

(56) References Cited

U.S. PATENT DOCUMENTS

| | | | | |
|---|---|---|---|---|
| 3,515,615 A | * | 6/1970 | Okada et al. ............ | 156/273.3 |
| 4,587,199 A | * | 5/1986 | Bennett .................... | 156/286 |
| 4,933,123 A | * | 6/1990 | Yoshida et al. .......... | 264/446 |
| 5,098,618 A | * | 3/1992 | Zelez ...................... | 264/446 |
| 5,759,674 A | * | 6/1998 | Furuta et al. ............ | 428/901 |
| 6,124,004 A | * | 9/2000 | Furuta et al. ............ | 428/901 |

FOREIGN PATENT DOCUMENTS

| | | |
|---|---|---|
| EP | A10697278 | 2/1996 |
| JP | A1216824 | 8/1989 |
| JP | A4166323 | 6/1992 |
| JP | A9100359 | 4/1997 |

\* cited by examiner

*Primary Examiner*—Steven D. Maki
(74) *Attorney, Agent, or Firm*—Birch, Stewart, Kolasch & Birch, LLP

(57) ABSTRACT

Disclosed herein is a process for melt-bonding a molded article of a thermotropic liquid crystalline polyester with a metal, which comprises activating or irradiating a surface of a molded article of a thermotropic liquid crystalline polyester resin and melt-bonding the surface with a metal at or above the flow temperature of the thermotropic liquid crystalline polyester.

6 Claims, No Drawings

PROCESS FOR MELT-BONDING MOLDED ARTICLE OF LIQUID CRYSTALLINE POLYESTER WITH METAL

BACKGROUND OF THE INVENTION

1. Field of the Invention

The present invention relates to a process for melt-bonding a molded article of a thermotropic liquid crystalline polyester resin with a metal and a process for producing a molded article formed from a molded article of a thermotropic liquid crystalline polyester resin and a metal.

2. Description of the Related Art

Since thermotropic liquid crystalline polyester resins (hereinafter, sometimes may be referred to as liquid crystalline polymers) have characteristics that they are superior in heat resistance and excellent in flowability at a molten state, they have become widely used centering around the field of electronic materials as injection molding materials usable in high precision molding. One of use thereof in which their heat resistance and lower linear thermal expansion, parts of their excellent characteristics, are made good use is a product for use as mechanical parts, electric parts and electronic parts produced by plating or adhering a metal on a surface of a part molded by injection molding or a film molded by extrusion molding.

In these parts, the molded article and the metal must be adhered with a sufficient strength for practical use. The molded articles of a thermotropic liquid crystalline polyester resin, however, have a weak contact ability because of strong molecular orientation on the surface of molded article and are inactive to almost all chemicals. Therefore, sometimes a sufficient adhesive strength can not be obtained upon adhesion or plating.

Thus, various processes have been attempted for improving adhesive strength between molded articles of a thermotropic liquid crystalline polyester resin and metals. For example, JP-A-1-216824 discloses, as a method for modifying a surface of a molded article of a thermotropic liquid crystalline polyester, a process for obtaining a surface suitable for painting, printing, adhesion, deposition, plating and so on by irradiating with ultraviolet rays. In addition, JP-A-9-100359 discloses a process for obtaining a surface of a molded article excellent in adhesive strength upon plating or others by partially irradiating a surface of a molded article of a thermotropic liquid crystalline polyester resin with ultraviolet rays and then roughening the surface with an etching solution.

When, however, a thermotropic liquid crystalline polyester resin is adhered to a metal by an adhesive, the property of the adhered molded article is strongly damaged due to an inferior property of the adhesive, although the thermotropic liquid crystalline polyester resin is excellent in properties such as heat resistance and dielectric property. In addition, plating requires troublesome steps such as etching.

On the other hand, various processes have been attempted in which a metal and a thermotropic liquid crystalline polyester resin are melt-bonded rather than adhering or plating. In one example, JP-A-8-58024 discloses a process for obtaining a laminate useful as a substrate for circuit by melt-bonding a film of thermotropic liquid crystalline polyester resin with a copper foil.

Even such a product obtained by a process in which a molded article of thermotropic liquid crystalline polyester resin is melt-bonded with a metal has sometimes not a sufficient adhesive strength between the liquid crystalline polyester resin and the metal.

The object of the present invention is to provide a process for melt-bonding a molded article of a thermotropic liquid crystalline polyester resin with a metal with firmness and a process for producing a laminated product in which a molded article of a thermotropic liquid crystalline polyester resin molded article and a metal is laminated with firmness.

SUMMARY OF THE INVENTION

As the result of extensive studies for resolving the above problems, the present inventors have found that the above object can be attained by previously activating a surface of a molded article of a thermotropic liquid crystalline polyester resin and melt-bonding said surface with a metal at or above the flow temperature of said thermotropic liquid crystalline polyester resin. Thus, they have completed the present invention.

The present invention relates to (1) a process for melt-bonding a molded article of a thermotropic liquid crystalline polyester with a metal which comprises activating a surface of a molded article of a thermotropic liquid crystalline polyester resin and melt-bonding said surface with a metal at or above the flow temperature of said thermotropic liquid crystalline polyester resin.

Also, the present invention relates to (2) a process for melt-bonding a molded article of a thermotropic liquid crystalline polyester with a metal which comprises previously irradiating a surface of a molded article of a thermotropic liquid crystalline polyester resin with ultraviolet rays containing a wavelength 254 nm and melt-bonding said surface with a metal at or above the flow temperature of said thermotropic liquid crystalline polyester resin.

Further, the present invention relates to (3) a molded article comprising a molded article of a thermotropic liquid crystalline polyester and a metal, which is melt-bonded by the process according to above (1) or (2).

Still further, the present invention relates to (4) a process for producing a molded article formed from a molded article of a thermotropic liquid crystalline polyester and a metal which comprises, in a process for producing a molded article formed from a molded article of a thermotropic liquid crystalline polyester and a metal, previously irradiating a surface of a molded article of a thermotropic liquid crystalline polyester resin with ultraviolet rays containing a wavelength 254 nm and melt-bonding said surface with a metal at or above the flow temperature of said thermotropic liquid crystalline polyester resin.

Further, the present invention relates to (5) a process for producing a laminated product formed from a thermotropic liquid crystalline polyester and a metal which comprises, in a process for producing a laminated product formed from a molded article of a thermotropic liquid crystalline polyester and a metal, previously irradiating a surface of a molded article of a thermotropic liquid,crystalline polyester resin with ultraviolet rays containing a wavelength 254 nm and melt-bonding said surface with a metal at or above the flow temperature of said thermotropic liquid crystalline polyester resin.

DETAILED DESCRIPTION OF THE INVENTION

The molded article of a thermotropic liquid crystalline polyester used in the present invention is a product molded from thermotropic liquid crystalline polyester resin by injection molding, extrusion molding or the like. Particularly, the molded articles in the form of films or sheet can be used as substrates for circuit excellent in heat resistance, dimension accuracy and the like by bonding together with a copper foil.

The thermotropic liquid crystalline polyester resin for obtaining such molded article can be obtained by polycondensation reaction with combining monomers of an aromatic hydroxyl carboxylic acid, an aromatic dicarboxylic acid and an aromatic dihydroxyl compound.

Examples of the aromatic hydroxyl carboxylic acid unit include:

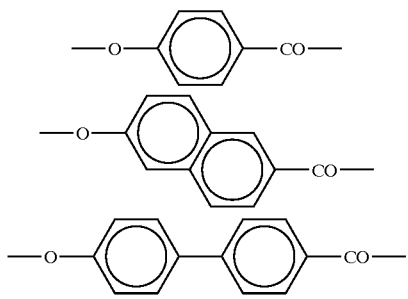

Examples of the aromatic dihydroxyl compound unit include:

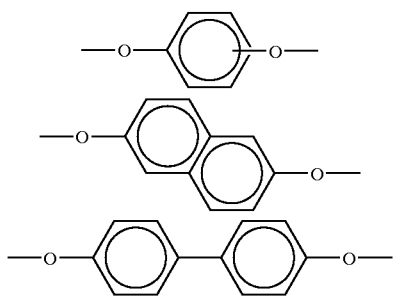

Examples of the aromatic dicarboxylic acid unit include:

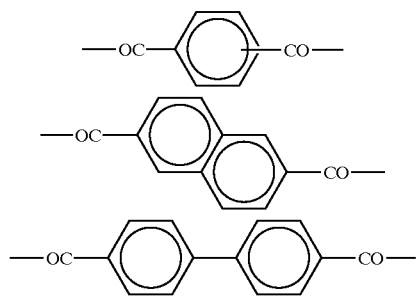

While combination and ratio of the monomer components may be determined according to desired object, it is preferred that the components represented by the following formulae (1), (2), (3) and (4) or formulae (1) and (5) are contained in an amount of 97% by mole or more, based on the total amount, for a liquid crystalline polyester having a high heat resistance and a suitable flowability.

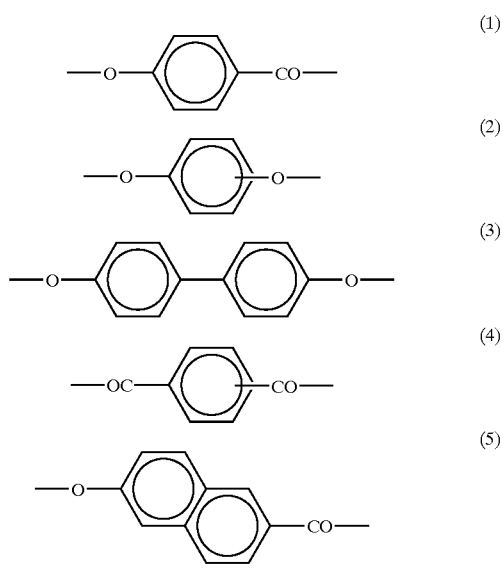

Among them, components represented by the formulae (1), (2), (3) and (4) are preferred for thermotropic liquid. crystalline polyester resin having a higher heat resistance. More preferred are those having the component represented by the formula (1) in an amount of 40 to 70% by mole based on the total amount, the amount of the components represented by the formula (2) plus formula (3) is 15 to 30% by mole based on the total amount, which is substantially the same as that for the component represented by the formula (4), and additionally, among the component (2), a proportion of a component in which the principal chains are bound in the para-position is 80 to 100% by mole based on the total component (2), and among the component (4), a proportion of a component in which the principal chains are bound in the para-position is 50% by mole or more based on the total component (4).

As a process for producing liquid crystalline polyester resin used in the molded article of the invention, any conventional processes can be used without particular limitation. For example, the resin can be obtained by carrying out a polycondensation reaction of a mixture comprising the above monomer compounds in a polymerization vessel. In this case, charging of the compounds may be in one portion or in divided portions. The reaction can be performed in an inert gas, for example under a nitrogen atmosphere, at the ordinary pressure or a reduced pressure, or a combination of them. For the process, a batch system, a continuous system or a combination of them may be adopted. In addition, the polycondensation reaction can be performed subsequent to a reaction (for example, esterification reaction) for converting the above monomer compound to a more easily polymerizing compound.

Preferred temperature for the polycondensation reaction is 270 to 380° C. When the temperature is lower than 270° C., the polymerization reaction is slow and when it is higher than 380° C., side reactions tend to occur. Multiple step reaction temperature may be adopted. In some cases, it is also possible to take out and collect the polymer as the reaction product in a molten state in halfway of elevation of temperature or immediately after reaching to the maximum temperature. The collected polymer can be solidified and divided into powders or directly introduced from the polymerization vessel to an extruder and pelletized.

Alternatively, the collected polymer can be subjected to a post-treatment such as solid phase polymerization by heating under a nitrogen atmosphere in order to increase further the molecular weight of the polymer.

It is preferred, for handling, that the obtained powders of liquid crystalline polymer are pelletized by an extruder and molded by an injection molding machine or an extrusion molding machine.

In addition, insofar as the object of the invention is adversely affected, various additives such as inorganic filler, organic filler, antioxidant, heat stabilizer, light stabilizer, flame retarder, lubricant, antistatic agent, rust preventing agent, fluorescent agent, surface smoothing agent, surface modifying agent, mold release agent and the like can be added. Particularly, for use as a injection molding material, it is preferred to add 30 to 40% by weight of fillers such as glass fibers, talc or the like based on the polymer in order to improve the elasticity or diminish anisotropy of molded parts.

It is preferred that the liquid crystalline polymer used in the invention has a ratio (viscosity 2)/(viscosity 1) of 0.10 to 0.70, more preferably 0.1 to 0.50, wherein(viscosity 1) is a melt viscosity under a shear rate of 1,000 $sec^{-1}$ at a temperature at which an anisotropy melt phase begins (flow temperature) and (viscosity 2) is a melt viscosity measured under the same shear rate at a temperature higher by 20° C. than the flow temperature. The flow temperature herein refers to a temperature at which a resin heated at a rate of 4° C./minute shows a melt viscosity 48,000 poise when the resin is extruded from a nozzle having an inside diameter of 1 mm and a length of 10 mm under a load of 100 $Kgf/cm^2$. The ratio of melt viscosity outside the above range is not preferred because, particularly when a film or a sheet is molded by extrusion molding, sometimes processability such as film winding property becomes inferior or anisotropy of the obtained product becomes large and thus the product can not be practically used.

It is preferred that, in the heat resistance, the liquid crystalline polyester resin used in the invention has a soldering heat resistance of 250° C. or higher. The soldering heat resistance herein refers to the maximum temperature at which no blister or deformation is observed in a series of experiments in which a JIS 1(1/2) dumb-bell test piece having a thickness of 1.2 mm is molded, immersed in a solder bath at 240° C. consisting of 60% of tin and 40% of lead, taken out after holding at the same temperature for 60 seconds and checked for outside appearance, and the procedure is repeated elevating every time the temperature of the solder bath by 10° C. When the soldering heat resistance is lower than 250° C., many limitations occur in use, for example, use of a part melt-bonded with a metal obtained in the invention in a solder reflow furnace.

It is preferred that the liquid crystalline polyester resin used in the invention has a melt tension of 10 g or more. The melt tension herein is an expression of a force charged on a tension pulley when a monofilament is broken in an experiment in which a resin is melted in a die of 8.0 mm (length)×2.1 mm φ kept at a temperature 30° C. higher than the flow temperature of said resin, extruded at a piston velocity of 2 mm/minute, taken off in the form of the monofilament with rollers after passing through the tension pulley and the taking off velocity is gradually increased. When the melt tension is lower than 10 g, processing for obtaining a molded article of the liquid crystalline polyester for use in the present invention sometimes becomes difficult due to insufficient elongation particularly in melt extrusion of a film or molding of a sheet.

Also, it is preferred that the intrinsic viscosity [η] of the liquid crystalline polyester resin used in the invention is 5.5 or more. When [η] is lower than 5.5, it is difficult to attain the above described melt viscosity characteristic and melt tension.

The liquid crystalline polymer obtained in this manner is treated and shaped by an injection molding machine or extrusion molding machine. Particularly, for the purpose of forming a substrate for circuit by melt-bonding with a metal, molded articles in the form of a film or sheet are preferred for handling and so on. More preferred is a film.

Particularly, examples of molding method for forming a film include the cast method in which a molten resin is extruded in a desired width and thickness from a slit-form machine called T-die and cooled as it is to form a film; the drawing method in which an extruded film is serially drawn in the machine direction and the crossing direction; and the film blowing method in which the resin is extruded in the cylindrical form from a circular die and blown simultaneously in the taking off direction and in the crossing direction by a gas. In the case of a liquid crystalline polymer, the blowing method is preferred because of easiness in controlling the anisotropy.

The process for melt-bonding the molded article of a thermotropic liquid crystalline polyester with a metal and the process for producing the molded article or laminated product according to the invention are described below.

The process for melt-bonding the molded article of a thermotropic liquid crystalline polyester with a metal is characterized in that it comprises activating a surface of a molded article of a thermotropic liquid crystalline polyester resin and melt-bonding said surface with a metal at or above the flow temperature of said thermotropic liquid crystalline polyester resin. The method for activating a surface of a molded article of a thermotropic liquid crystalline polyester resin includes previous irradiating with ultraviolet rays, corona discharge and plasma treatment. Particularly, it is preferred to irradiate a surface of a molded article of a thermotropic liquid crystalline polyester resin with ultraviolet rays containing a wavelength 254 nm.

The activated state of the surface of a liquid crystalline polyester resin includes a state where the resin surface oxidized, or a state where the functional group was formed by irradiation of ultraviolet rays, corona discharge or plasma treatment.

The oxidation degree of the resin surface is not limited especially, if the effect of the present invention is attained. For example, the oxygen atom in the element which constitutes the surface increases 5% or more, suitably 20% or more compared with the state before activation.

As the functional group formed in the surface, for example, hydroxyl group, a carbonyl group, etc. are exemplified, without being limited thereto.

Moreover, the density of the functional group is not limited especially, if the effect of the present invention can be attained.

Such activation is confirmed by measuring surface element composition with X-ray photoelectron spectroscopy. Moreover, when hydrophilic functional groups, such as a hydroxyl group and a carbonyl group, are formed in the surface, it is confirmed from lowering of the contact angle of water to the surface.

The molded article formed from a molded article of a thermotropic liquid crystalline polyester resin and a metal is obtained by applying the above described melt-bonding process. Particularly, a thin laminated product formed from a molded article of a thermotropic liquid crystalline polyester resin and a metal is obtained by applying the above described melt-bonding process to a thermotropic liquid crystalline polyester film or sheet and a metal. Hereinafter, the melt-bonding process is principally described but it is to be understood that the same process can be applied for the production of a molded article or a laminated product formed from a molded article of a thermotropic liquid crystalline polyester and a metal.

In the present invention, when the molded article of the thermotropic liquid crystalline polyester resin and a metal is melt-bonded, the temperature-for melt-bonding is preferably in a range of from the flow temperature plus 10 to 60° C., more preferably plus 30 to 60° C. When the temperature for melt-bonding is lower than the flow temperature plus 10° C., sometimes the adhesive strength between the molded article and the metal is insufficient and when it is higher than the flow temperature plus 60° C., sometimes deformation of the molded article becomes remarkable.

It is preferred that the surface roughness, expressed by Ra (average roughness along the central line), of the molded article of a thermotropic liquid crystalline polyester resin, obtained as described above, at a slide to be melt-bonded with a metal is in a range of from 1 to 50 μm. Methods for adjusting the surface roughness at such value include, without limitation, a method in which the surface roughness of the mold cavity for use in the injection molding is adjusted to copy said roughness to the surface of the molded article; a method in which a film is continuously passed through a roll having embossment with compression and heating to copy said embossment; and a method in which a mold having embossment is pressed onto the molded article to copy the embossment.

The metal for melt-bonding with the molded article of a thermotropic liquid crystalline polyester resin used in the invention include copper, silver, gold, iron, zinc, magnesium, nickel and the like as well as alloy thereof. These may be an independent material or composite material. In addition, it can be a surface-treated metal, for example one treated with an aminosilane agent, insofar as the object of the invention is not prevented.

The form of the metal may be wires for forming an electric or an electronic circuit, or foils for forming a circuit by etching treatment, in addition to forms as structural parts. Particularly, for complex and fines circuit, a copper foil is preferred. When a copper foil is used, the foil is melt-bonded with a molded article of a thermotropic liquid crystalline polyester resin and then etched to form a circuit.

The copper foil, called electrolytic copper foil, generally has a thickness of 2 to 200 μm, has fine copper particles deposited on a surface, coated with zinc or nickel and surface-treated. The present invention, however, is not limited to such foil.

Methods for melt-bonding the molded article of a thermotropic liquid crystalline polyester resin with a metal include a method in which the molded article and the metal are heated in a press machine set at the above described temperature for melt-bonding; a method in which the metal preheated to the above described temperature for melt-bonding is subjected to contact-bonding with the molded article; a method in which a molded article in the form of a film or a sheet and a metal foil are continuously compressed with hot rolls set at the above described temperature for melt-bonding and so on. In addition, each of the molded article and the metal may be adhered by one side or be adhered by both sides of one or both. Such manner is selected according to the shape required by desired parts.

In addition, it is possible to obtain a single melt-bonded molded article by a single melt-bonding operation from, for example, a molded article and a metal compressed with a press machine. Alternatively, it is also possible to obtain plurality of melt-bonded molded articles, separated between plurality of pairs of melt-bonded: metal and molded article with release film or the like by a single melt-bonding operation.

EXAMPLES

The embodiments of the present invention will now be described by reference of Examples, which should not be construed as a limitation upon the scope of the present invention.

Methods for measuring physical properties are described below.

Adhesive strength: A test specimen of 10 mm in width and 64 mm in length was cut off from a test piece produced by melt-bonding a metal foil and a molded article and subjected to peeling strength measurement by 90° C. peeling test (taking-off rate: 50 mm/minute) of the metal using Autograph AG-5000D manufactured by Shimadzu Corp.

Surface roughness: The surface roughness of a molded article to be melt-bonded was measured with a non-contact surface roughness meter Focodyn and a perthometer C5D manufactured by Feinpruf Perthen GmbH.

Flow temperature: This was measured with Koka Type Flow Tester CFT-500 manufactured by Shimadzu Corp. Briefly, a temperature at which a resin heated at a rate of 4° C./minute showed a melt viscosity 48,000 poise was measured and taken as the flow temperature when the resin is extruded from a nozzle having an inside diameter of 1 mm and a length of 10 mm under a load of 100 Kgf/cm$^2$.

Melt viscosity: This was measured at a predetermined temperature with a die having an inside diameter of 0.5 mm and a length of 10 mm at shear rate of 1,000 sec$^{-1}$ using Capillograph 1B manufactured by Toyo Seiki Seisaku-Sho, Ltd.

Melt tension: A force charged on a tension pulley was measured in grams, using Capillograph 1B manufactured by Toyo Seiki Co, when a monofilament is broken in an experiment with an apparatus in which a resin is melted in a die of 8.0 mm (length)×2.1 mm φ kept at a predetermined temperature, extruded at a piston velocity of 2 mm/minute, taken off in the form of the monofilament with rollers after passing through the tension pulley and the taking off velocity is gradually increased.

Intrinsic viscosity [η]: This was measured with a Ubbelohde viscometer at 60° C. for a liquid crystalline polyester resin dissolved in 3,5-bistrifluoromethylphenol.

The soldering heat resistance: The maximum temperature at which no blister or deformation was observed was measured in a series of experiments in which a JIS 1(1/2) dumb-bell test piece having a thickness of 1.2 mm: is molded by an injection molding machine, dipped in a solder bath at 230° C. consisting of 60% of tin and 40% of lead, taken out after holding at the same temperature for 60 seconds and checked for outside appearance, and the procedure is repeated elevating every time the temperature of the solder bath by 10° C.

Reference Example 1

Into a polymerization vessel equipped with a comb type agitator were charged 10.8 kg (60 moles) of p-acetoxybenzoic acid, 2.49 kg (15 moles) of terephthalic acid, 0.83 kg (5 moles) of isophthalic acid and 5.45 kg (20.2 moles) of 4,4'-diacetoxydiphenyl. The mixture was heated with agitation under a nitrogen atmosphere and allowed to polymerize at 330° C. for 1 hour. The polymerization was performed with a vigorous agitation while removing acetic acid as a by-product. Then the reaction system was gradually cooled to 200° C. when the obtained polymer was taken-out from the system. The obtained polymer was divided with a hammer mill manufactured by Hosokawa Micron Corp. to give particles of 2.5 mm or smaller.

The product was treated in a rotary kiln at 290° C. for 3 hours under a nitrogen atmosphere to give a totally aromatic polyester granular resin having a flow temperature of 341° C. and containing the following repeating units:

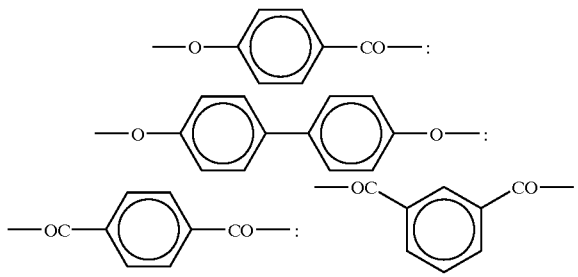

=60:20:15:5 (molar ratio)

This thermotropic liquid crystalline polyester resin was pelletized with a twin-screw extruder (PCM-30, manufactured by Ikegai corp.) at a cylinder temperature of 350° C. to give pellets. The pellets were molded with an injection molding machine (PS40E5ASE, manufactured by Nissei Plastic Industrial Co., Ltd.) at a cylinder temperature of 360° C. and a die temperature of 130° C. to give a flat board of 64×64×1mmt and a test piece for the above described solder bath test. The physical properties of the resin were measured according to the above described methods. The results were as follows:

Flow temperature: 332° C.;

Intrinsic viscosity [η]: 6.8

Melt viscosity (measured at a shearing rate of 1,000 $sec^{-1}$, 332° C.): 9500 poise, Melt viscosity (measured at a shearing rate of 1,000 $sec^{-1}$, 352° C.): 1400 poise Ratio of melt viscosity: 0.15

Melt tension: 25 g;

Soldering heat resistance: 290° C.

Comparative Example 1

The flat board molded in Reference Example 1 and a copper foil (thickness: 18 μm) were bonded together. The flat board was used after being wiped with ethanol and dried at 120° C. for 8 hours or more, and melt-bonded to the mat side (a side having deposited fine copper particles) of the copper foil as follows. The flat board (surface roughness: 0.8 μm) and the copper foil were piled together, and sandwiched between aluminum boards (thickness: 0.1 mm) and further SUS boards (thickness: 3 mm). Here, the order of piling is, SUS board/aluminum board/flat board/copper foil/aluminum board/SUS board. The above piled flat board specimen was interposed between platens of a press machine preliminarily set at 350° C. Immediately after, the flat board is compressed at a pressure of 40 kg/cm² and kept for 2 minutes. Then the specimen was transferred to a cold press machine and cooled for 3 minutes. The SUS board and the aluminum board were removed to give a melt-bonded molded article of the thermotropic liquid crystalline polyester resin and the copper foil. The product was cut into a section having a width of 10 mm along MD (machine direction) of the molded article as described above and its peeling strength was measured. In addition, the interfacial surfaces formed by peeling were observed. The test results are as follows.

Peeling strength: 0.6 kg/cm State of peeling: interfacial peeling (peeling is occurred at the interface between the resin and the copper foil).

Example 1

The procedure in Comparative Example was substantially repeated except that a surface of a flat board wiped with ethanol and dried at 120° C. for 8 hours or more was irradiated with ultraviolet rays using a low-pressure mercury lamp (surface modification apparatus, 17 mW/cm² (at a wave length of 254 nm), manufactured by Sen Lights Corporation) for 10 minutes and the irradiated surface of the flat board was bonded to the copper foil. The product was subjected to peeling strength measurement and peeling state was observed. The results are as follows.

Peeling strength: 0.9 kg/cm

State of peeling: material break down (breakage is observed in the resin.)

Reference Example 2

The element constition on the plate surface was measured by X-ray photoelectron spectrometer (Surface Science Instruments Inc.). as to the plate before melt-bonding, used in Comparative Example 1, and that after ultraviolet irradiation used in Example 1. Moreover, the contact angle of water to each surface was measured using a contact angle of measurement device (CA-A: Kyowa Interface Science Co.Ltd.). The results are shown in Table 1.

TABLE 1

| | Element Constitution of surface (%) | | | Contact Angle |
|---|---|---|---|---|
| | C | O | N | |
| Comparative Example 1 | 80 | 20 | 0 | 73° |
| Example 1 | 72 | 26 | 2 | 49° |

Examples 2, 3 and Comparative Example 2

The board was bonded to the copper foil substantially in the same manner as in Example 1 except that, in the melt bonding, the temperature of platens was set at temperatures shown below. The product was subjected to peeling strength measurement and observation of peeling state. The results are as follows.

TABLE 2

|  | Temperature of platens (° C.) | Peeling strength (kg/cm) | State of peeling |
|---|---|---|---|
| Comparative example 2 | 330 | 0.6 | Material break down*1 |
| Example 2 | 370 | 1.0 | Material break down |
| Example 3 | 390 | 1.1 | Material break down |

*1Breakage is observed in the resin.

Comparative Example 3

The board was bonded to the copper foil substantially in the same manner as in Comparative Example 1 except that, in the melt-bonding, the temperature of platens was set at 390° C. The product was subjected-to peeling strength measurement and observation of peeling state. The results are as follows.

Peeling strength: 0.8 kg/cm

State of peeling: interfacial peeling

Examples 4 and 5

The procedures of surface wiping, ultraviolet irradiation and bonding in Example 1 were substantially repeated except that a flat board to be melt-bonded with copper foil was a board of which a surface was roughened by the method shown below. The product was subjected to peeling strength measurement and the peeling states was observed. Method for roughening surface: The flat board wiped with ethanol on which a fluorine resin film (thickness: 0.05 mm) and a sandpaper (#320 or #600) are piled in this order, is sandwiched between aluminum boards (thickness: 0.1 mm), silicone sheets (thickness: 1 mm) and SUS boards (thickness: 3 mm). Here, the order of piling is, SUS board/silicone sheet/aluminum board/sandpaper/fluorine resin film/flat board/aluminum board/silicone sheet/SUS board. The above sandwiched flat board is interposed between platens of a press machine preliminarily set at 250 ° C. Immediate after, the flat board is compressed at a pressure of 10 kg/cm² and kept for 5 minutes. Then the specimen is transferred to a cold press machine and cooled for 3 minutes. The SUS board, aluminum board, silicone sheet, sandpaper and fluorine resin film are removed to give a thermotropic liquid crystalline polyester resin of which the surface is subjected to roughening treatment.

The results are shown as follows.

TABLE 3

|  | Sandpaper used | Surface roughness (μm) | Peeling test |
|---|---|---|---|
| Example 4 | #320 | 4 | Breakage in deep place of the material*2 |
| Example 5 | #600 | 2 | Breakage in deep place of the material*2 |

*2Breakage occurred in the depth of the material not at the interfacial portion, and the peeling strength could not be obtained.

Comparative Example 4

The procedures in Comparative Example 1 were substantially repeated except that a flat board to be melt-bonded with copper foil was a board of which a surface was roughened to have a surface roughness of 4 μm by the method described above. The product was subjected to peeling strength measurement and observation of peeling state. The sandpaper used was #320. The obtained results are as follows.

Peeling strength: 0.7 kg/cm

State of peeling: interfacial peeling

According to the present invention, a molded article of a thermotropic liquid crystalline polyester resin molded article and a metal can be melt-bonded with firmness. In addition, according to the present invention, a molded article and a laminate formed from a molded article of a thermotropic liquid crystalline polyester resin molded article and a metal, which are strongly bonded, can be obtained. The molded article and the laminate are very useful in applications such as substrates for electric or electronic circuit, industrial machines and equipment, electric appliances for home use, office appliances, electric or electronic parts and so on.

What is claimed is:

1. A process for melt-bonding a molded article of a thermotrophic liquid crystalline polyester with a metal which comprises:

irradiating a surface of a molded article of a thermotropic liquid crystalline polyester resin with ultraviolet rays containing a wavelength of 254 nm;

roughening the surface to have a surface roughness Ra in a range of 1 to 50 μm; and subsequently melt-bonding said surface with a metal at or above a flow temperature of said thermotropic liquid crystalline polyester resin.

2. A process for melt-bonding a molded article of a thermotropic liquid crystalline polyester with a metal according to claim 1, wherein the temperature for melt-bonding is 10° C. to 60° C. above the flow temperature.

3. A process for melt-bonding a molded article of a thermotropic liquid crystalline polyester with a metal according to claim 1, wherein the molded article of a thermotropic liquid crystalline polyester resin is a film or a sheet consisting essentially of a resin.

4. A process for melt-bonding a molded article of a thermotropic liquid crystalline polyester with a metal according to claim 1, wherein the thermotropic liquid crystalline polyester resin has a ratio (viscosity 2)/(viscosity 1) of 0.10 to 0.70, wherein (viscosity 1) is a melt viscosity measured under a shear rate of 1,000 sec$^{-1}$ at a flow temperature and (viscosity 2) is a melt viscosity measured under the same shear rate at a temperature 200° C. above said flow temperature, and has a soldering heat resistance of 250° C. or higher.

5. A process for melt-bonding a molded article of a molded article of a thermotropic liquid crystalline polyester with a metal according to claim 1, wherein the metal is an electrolytic copper foil.

6. A molded article comprising a molded article of a thermotropic liquid crystalline polyester and a metal which is melt-bonded by the process defined in claim 1.

* * * * *